(12) United States Patent
Kuo et al.

(10) Patent No.: US 9,184,152 B2
(45) Date of Patent: Nov. 10, 2015

(54) DUAL LEAD FRAME SEMICONDUCTOR PACKAGE AND METHOD OF MANUFACTURE

(71) Applicants: Frank Kuo, Kaohsiung (TW); Suresh Belani, Los Altos, CA (US)

(72) Inventors: Frank Kuo, Kaohsiung (TW); Suresh Belani, Los Altos, CA (US)

(73) Assignee: Vishay-Siliconix, Santa Clara, CA (US)

( * ) Notice: Subject to any disclaimer, the term of this patent is extended or adjusted under 35 U.S.C. 154(b) by 0 days.

(21) Appl. No.: 14/341,772

(22) Filed: Jul. 26, 2014

(65) Prior Publication Data

US 2014/0332939 A1 Nov. 13, 2014

Related U.S. Application Data

(62) Division of application No. 13/229,667, filed on Sep. 9, 2011, now Pat. No. 8,822,273.

(51) Int. Cl.
*H01L 29/72* (2006.01)
*H01L 23/00* (2006.01)
(Continued)

(52) U.S. Cl.
CPC ............ *H01L 24/90* (2013.01); *H01L 21/4825* (2013.01); *H01L 21/56* (2013.01); *H01L 21/78* (2013.01); *H01L 23/4952* (2013.01); *H01L 23/49524* (2013.01); *H01L 23/49562* (2013.01); *H01L 23/49575* (2013.01); *H01L 24/32* (2013.01); *H01L 24/33* (2013.01); *H01L 24/34* (2013.01); *H01L 24/83* (2013.01); *H01L 24/84* (2013.01); *H01L 24/97* (2013.01); *H01L 24/48* (2013.01); *H01L 24/49* (2013.01); *H01L 2224/32245* (2013.01); *H01L 2224/40247* (2013.01); *H01L 2224/45144* (2013.01); *H01L 2224/48247* (2013.01); *H01L 2224/49111* (2013.01); *H01L 2224/83801* (2013.01); *H01L 2224/97* (2013.01); *H01L 2924/00015* (2013.01); *H01L 2924/014* (2013.01); *H01L 2924/01005* (2013.01); *H01L 2924/01006* (2013.01); *H01L 2924/01033* (2013.01); *H01L 2924/01079* (2013.01); *H01L 2924/01082* (2013.01);
(Continued)

(58) Field of Classification Search
CPC .................................................... H01L 21/4825
USPC ................... 257/670, 672, 376, 787, E21.506
See application file for complete search history.

(56) References Cited

U.S. PATENT DOCUMENTS 6,475,834 B2 * 11/2002 Embong et al. ............... 438/123
6,777,800 B2    8/2004 Madrid et al.
(Continued)

FOREIGN PATENT DOCUMENTS

KR    10-2012-0125462    11/2012

*Primary Examiner* — Edward Wojciechowicz

(57) ABSTRACT

A semiconductor package and a method for making the same are provided. In the method, a clip is used to conduct a lead frame and at least one chip. The clip has at least one second connection segment, at least one third connection segment, and at least one intermediate connection segment. The second connection segment is electrically connected to a second conduction region of the chip and a second pin of the lead frame respectively, and the third connection segment is electrically connected to a third conduction region of the chip and a third pin of the lead frame respectively. The intermediate connection segment connects the at least one second connection segment and the at least one third connection segment, and is removed in a subsequent process. Thereby, the present invention does not need to use any gold wire, which effectively saves the material cost and the processing time.

7 Claims, 18 Drawing Sheets

(51) Int. Cl.
*H01L 23/495* (2006.01)
*H01L 21/48* (2006.01)
*H01L 21/56* (2006.01)
*H01L 21/78* (2006.01)

(52) U.S. Cl.
CPC ............ *H01L2924/1306* (2013.01); *H01L 2924/13091* (2013.01)

(56) References Cited

U.S. PATENT DOCUMENTS

| | | |
|---|---|---|
| 7,132,734 B2 | 11/2006 | Johnson |
| 7,238,551 B2 | 7/2007 | Kasem et al. |
| 7,271,470 B1 | 9/2007 | Otremba |
| 7,271,477 B2 | 9/2007 | Saito et al. |
| 7,902,646 B2 | 3/2011 | Liu et al. |
| 8,018,054 B2 | 9/2011 | Liu et al. |
| 8,358,014 B2 | 1/2013 | Koduri |
| 8,358,017 B2 | 1/2013 | Tsui |
| 8,461,669 B2 | 6/2013 | Yang et al. |
| 8,513,784 B2 | 8/2013 | Lu et al. |
| 8,581,376 B2 | 11/2013 | Yilmaz et al. |
| 8,604,597 B2 | 12/2013 | Jiang |
| 8,822,273 B2 | 9/2014 | Kuo et al. |
| 8,952,509 B1 | 2/2015 | Yilmaz et al. |
| 2001/0052641 A1 | 12/2001 | Kuo et al. |
| 2004/0063240 A1 | 4/2004 | Madrid et al. |
| 2004/0070352 A1 | 4/2004 | Shen |
| 2004/0256703 A1 | 12/2004 | Tu et al. |
| 2007/0096337 A1 | 5/2007 | Choi |
| 2007/0132073 A1 | 6/2007 | Tiong et al. |
| 2007/0132079 A1 | 6/2007 | Otremba et al. |
| 2007/0262346 A1 | 11/2007 | Otremba et al. |
| 2007/0278571 A1 | 12/2007 | Bhalla et al. |
| 2008/0211070 A1 | 9/2008 | Sun et al. |
| 2008/0233679 A1 | 9/2008 | Luo et al. |
| 2008/0246130 A1 | 10/2008 | Carney et al. |
| 2009/0057869 A1 | 3/2009 | Hebert et al. |
| 2009/0121331 A1 | 5/2009 | Cruz |
| 2009/0224383 A1 | 9/2009 | Cruz et al. |
| 2009/0294934 A1* | 12/2009 | Shi et al. ............... 257/670 |
| 2010/0171543 A1 | 7/2010 | Korec et al. |
| 2010/0301496 A1 | 12/2010 | Koduri |
| 2011/0024917 A1 | 2/2011 | Bhalla et al. |
| 2011/0089485 A1 | 4/2011 | Gao et al. |
| 2011/0095411 A1 | 4/2011 | Herbsommer et al. |
| 2011/0175217 A1 | 7/2011 | Jaunay et al. |
| 2011/0227207 A1* | 9/2011 | Yilmaz et al. ............ 257/676 |
| 2012/0049336 A1* | 3/2012 | Xue et al. ............... 257/676 |
| 2012/0112331 A1 | 5/2012 | Kuo |
| 2012/0119343 A1 | 5/2012 | Bayan et al. |
| 2012/0126323 A1 | 5/2012 | Wu et al. |
| 2012/0200281 A1 | 8/2012 | Herbsommer et al. |
| 2012/0280308 A1 | 11/2012 | Disney |
| 2012/0326287 A1 | 12/2012 | Joshi et al. |
| 2013/0256852 A1 | 10/2013 | Wyant et al. |
| 2014/0061884 A1 | 3/2014 | Carpenter et al. |
| 2014/0063744 A1 | 3/2014 | Lopez et al. |
| 2014/0084429 A1 | 3/2014 | Chen et al. |
| 2014/0117523 A1 | 5/2014 | Ho et al. |
| 2014/0264804 A1 | 9/2014 | Terrill et al. |
| 2014/0273344 A1 | 9/2014 | Terrill et al. |
| 2014/0370661 A1 | 12/2014 | Kuo et al. |
| 2015/0001618 A1 | 1/2015 | Hebert |

* cited by examiner

DUAL LEAD FRAME SEMICONDUCTOR PACKAGE AND METHOD OF MANUFACTURE

CROSS-REFERENCE TO RELATED APPLICATIONS

This is a divisional of U.S. patent application Ser. No. 13/229,667 filed Sep. 9, 2011, which is incorporated herein in its entirety.

BACKGROUND OF THE INVENTION

The manufacture of integrated circuits includes the packaging of the semiconductor chip. FIGS. 1, 2 and 3 illustrate a conventional method for making a semiconductor package. Referring to FIG. 1, a lead frame is provided. The lead frame 1 includes at least one drain pin 11, at least one source pin 13 and at least one gate pin 14. The drain pin 11, source pin 13 and gate pin are connected to a frame (not shown) by corresponding extensions 12. The source pin 13 and the gate pin 14 face a side of the drain pin 11, and a space exists between the source pin 13 and the side of the drain pin 11 and between the gate pin 14 and the side of the drain pin 11.

Referring now to FIG. 2, at least one chip 2 is provided. The chip 2 has an upper surface 21 and a lower surface (not shown). The upper surface 21 has a source conductive region 22 and a gate conductive region 23. The lower surface has a drain conductive region (not shown). The chip 2 is disposed so that the drain conductive region is electrically connected to the drain pin 11.

Referring, now to FIG. 3, a wiring process is performed. A first wire 31 is used to connect the source pin 13 of the lead frame 1 and the source conductive region 22 of the chip 2, and a second wire 32 is used to connect the gate pin 14 of the lead frame 1 and the gate conductive region 23 of the chip 2. The method may then continue with a molding process and a cutting process to further form the semiconductor package.

The conventional method for making the semiconductor package has the following disadvantages. The first wire 31 and the second wire 32 are gold wires, so the material cost is high. Moreover, during the wire bonding process, a wiring machine is used to form the first wire 31 and the second wire 32 one by one, which is time consuming. Further, a certain space must be reserved between the first wire 31 and the second wire 32 for the movement of a wiring head of the wiring machine, so that the space between the first wire 31 and the second wire 32 cannot be effectively narrowed, if the size of the chip 2 is reduced to a certain degree, the conventional method is not applicable.

Therefore, there is a continuing need to provide an improved semiconductor package and a method for making the same, to solve the above problems.

SUMMARY OF THE INVENTION

The present technology may best be understood by referring to the following description and accompanying drawings that are used to illustrate embodiments of the present technology directed toward a semiconductor package and method for making the same. The techniques, in one or more embodiments, include a semiconductor package of a transistor without any wires and a method of making the same.

In one embodiment a method of fabricating a semiconductor package includes providing a substrate lead frame, wherein the substrate lead frame comprises a substrate frame, at least one first substrate lead, at least one second substrate lead, and at least one third substrate lead, wherein the first substrate lead is connected to the substrate frame, the second substrate lead and the third substrate lead lace a side of the first substrate lead, and wherein the second substrate lead has a first extension portion connected to the substrate frame, and the third substrate lead has a second extension portion connected to the substrate frame. At least one IC chip is also provided, wherein the at least one IC chip has an upper surface and a lower surface, the upper surface has a second conductive region and a third conductive region, and the lower surface has a first conductive region. The at least one IC chip is disposed on the substrate. ham the first conductive region is electrically connected to the at least one first substrate lead. A clip lead frame is also provided, wherein the clip lead frame comprises a clip frame, at least one first clip lead, and at least one second clip lead, wherein the at least one first clip lead is connected to the clip frame and the at least one second clip is connected to the clip frame. The clip lead frame is disposed on the at least one. IC chip, wherein the first clip lead is electrically connected to the second conductive region of the at least one IC chip, the second clip lead is electrically connected to the third conductive region of the at least one IC chip. A molding process is performed and then a cutting process is performed to remove to form at least one semiconductor package each including at least one IC chip.

In another embodiment, a semiconductor package includes a substrate lead frame, at least one chip, a clip lead frame and molding compound. The substrate lead frame includes at least one substrate frame, at least one first substrate lead, at least one second substrate lead, and at least one third substrate lead, wherein the first substrate lead is connected to the substrate frame, the second substrate lead and the third substrate lead face a side of the first substrate lead, the second substrate lead has a first extension portion, and the third substrate lead has a second extension portion. The at least one chip are each located on the respective first substrate lead and having, an upper surface and a lower surface, wherein the upper surface has a second conductive region and a third conductive region, the lower surface has a first conductive region, and the first conductive region is electrically connected to the first substrate lead. The clip lead frame is located on the at least one chip and having at least one first clip lead and at least one second clip lead, wherein the first clip lead is electrically connected to the second conductive region of the at least one chip and the second substrate lead respectively, and the second clip lead is electrically connected to the third conductive region of the at least one chip and the third substrate lead respectively. The molding compound encapsulates the substrate lead frame, the at least one chip, and the clip lead frame, wherein the at least one first substrate lead, the at least one second substrate lead, the at least one third substrate lead are exposed to a side surface of the molding compound.

In yet another embodiment, a method of making a semiconductor package includes receiving, a substrate lead frame including a plurality of substrate lead set portions and a substrate frame portion, wherein each substrate lead set includes a first substrate lead, a second substrate lead and a third substrate lead, and wherein each of the first substrate leads, second substrate leads and third substrate leads are coupled to the substrate frame portion by one or more substrate extensions. A plurality of IC chips are also received, wherein each IC chip includes a first conductive region on a first surface, and a second conductive region and a third conductive region on a second surface. Each of the plurality of IC chips are disposed on the first substrate lead, clip lead frame is also received, the clip lead frame includes a plurality of clip lead set portions and a dip frame portion, wherein each dip lead set includes a first clip lead and a second clip lead, and wherein each of the first clip leads and second clip leads are coupled to the clip frame portion by one or more clip extensions. The clip lead frame is disposed on the plurality of IC chips, wherein each of the first clip leads is disposed between the second conductive region on a respective IC chip and the respective second substrate lead of the substrate lead frame and each of the second clip leads is disposed between the third conductive region on a respective IC chip and the respective third substrate lead of the substrate lead frame. The first substrate lead is coupled to the first conductive region of the respective IC chip. The first clip lead is coupled between the second conductive region on the respective IC chip and the second substrate lead. The second clip lead is coupled between the third conductive region on the respective IC chip and the third substrate lead for each of the plurality of IC chips. The substrate lead frame, the plurality of IC chips and the clip lead frame are then encapsulated before cutting the lead frame, plurality of IC chips and clip lead frame in a plurality of predetermined locations to separate the first substrate leads, second substrate leads and third substrate leads from the substrate frame and the first clip leads and the second clip leads from the clip frame to form packages each including at least one IC chip including the first substrate lead coupled to the respective IC chip, the first clip lead coupled between the respective IC chip and second substrate lead, and second clip lead coupled between the respective IC chip and the third substrate lead.

This Summary is provided to introduce a selection of concepts in a simplified form that are further described below m the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings at d in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details, In other instances, well-known methods, procedures, components, and circuits have not been described in detail as not to unnecessarily obscure aspects of the present technology.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to he understood that the phraseology and terminology used herein is for the purpose of description and should not be regarded as limiting.

Figure 1:
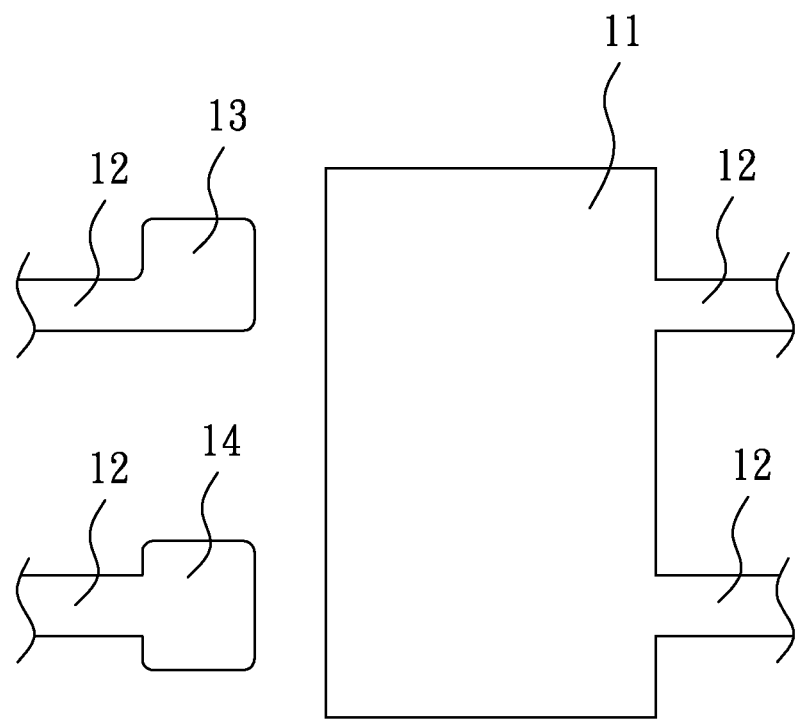
FIGS. 1, 2 and 3 show a schematic view illustrating various stages of a method for making a semiconductor package, according to the conventional art.
Figure 2:
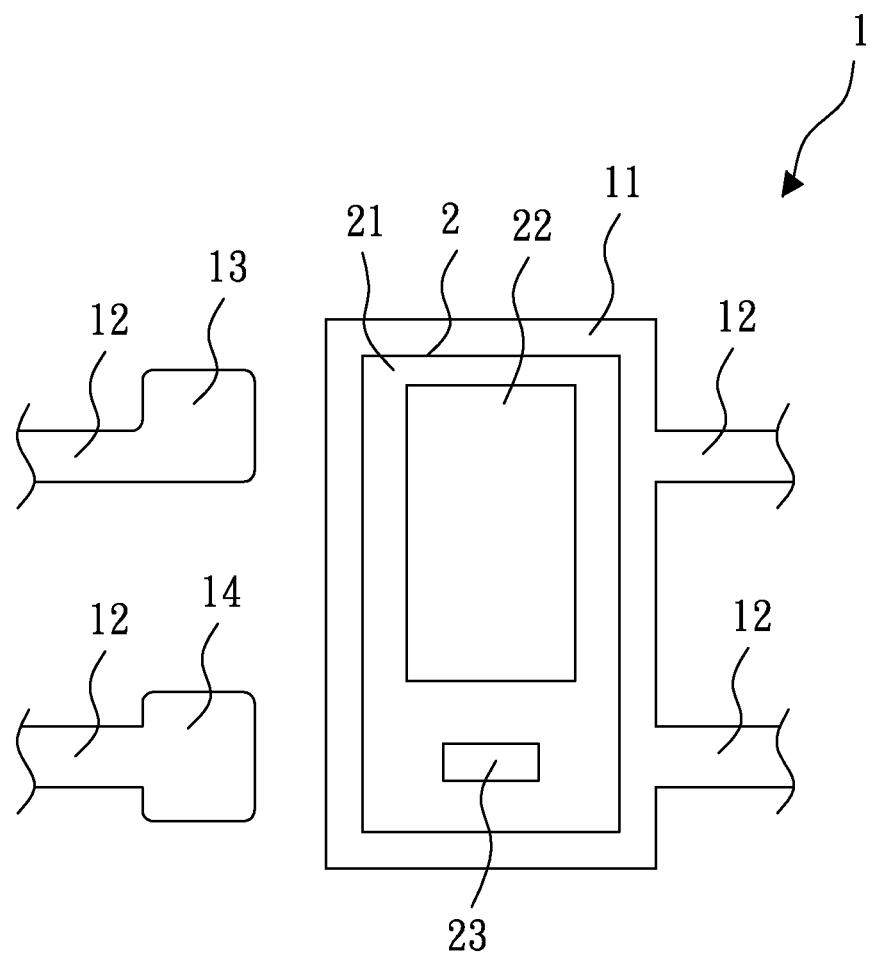
Figure 3:
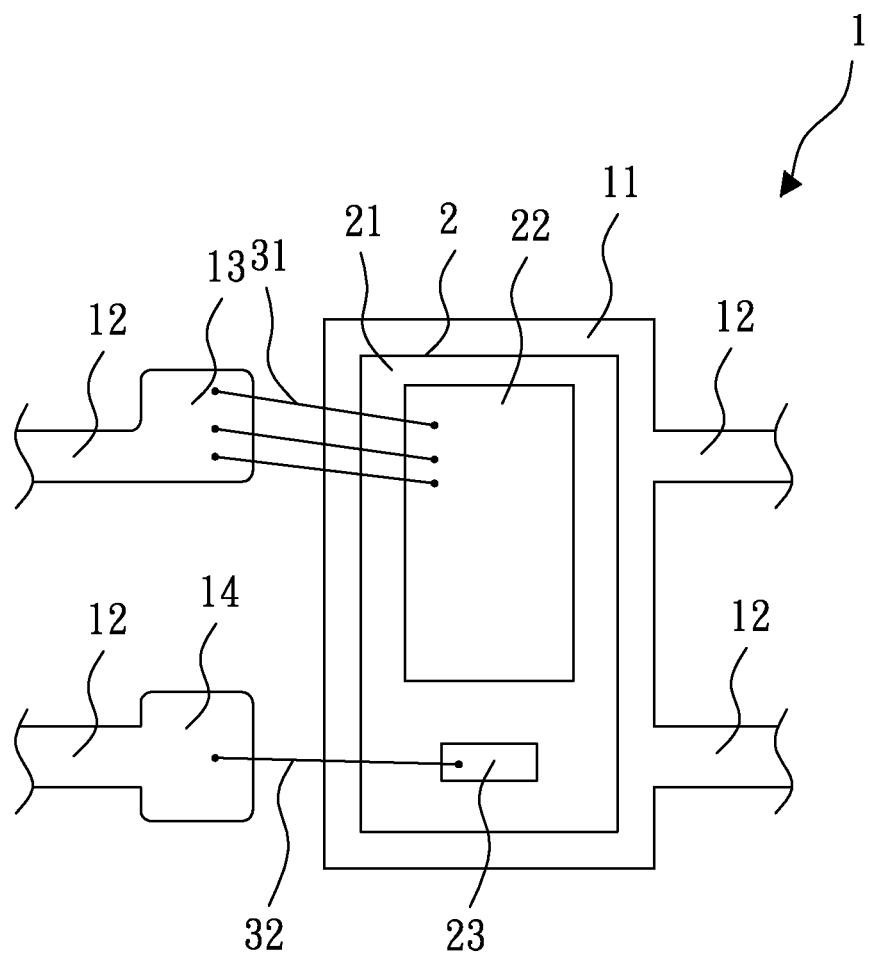
Figure 4:
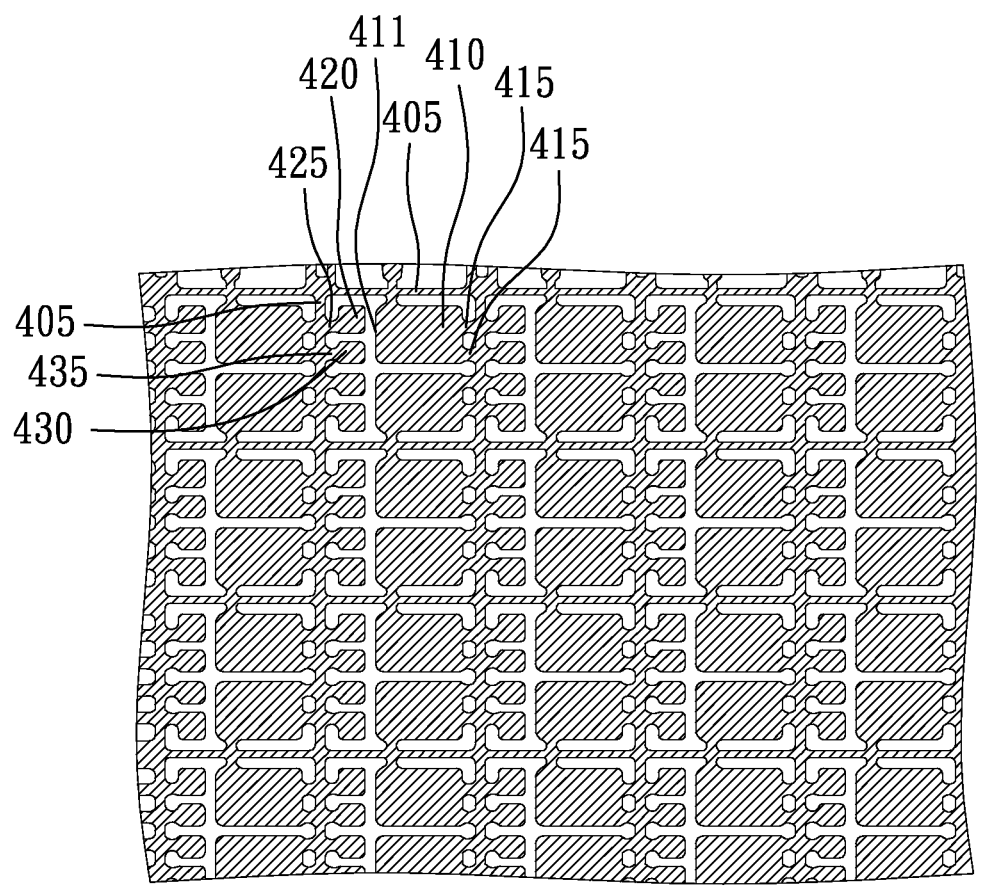
FIGS. 4 through 23 show a schematic view illustrating various stages of a method for making a semiconductor package, in accordance with one embodiment of the present technology.
Figure 5:
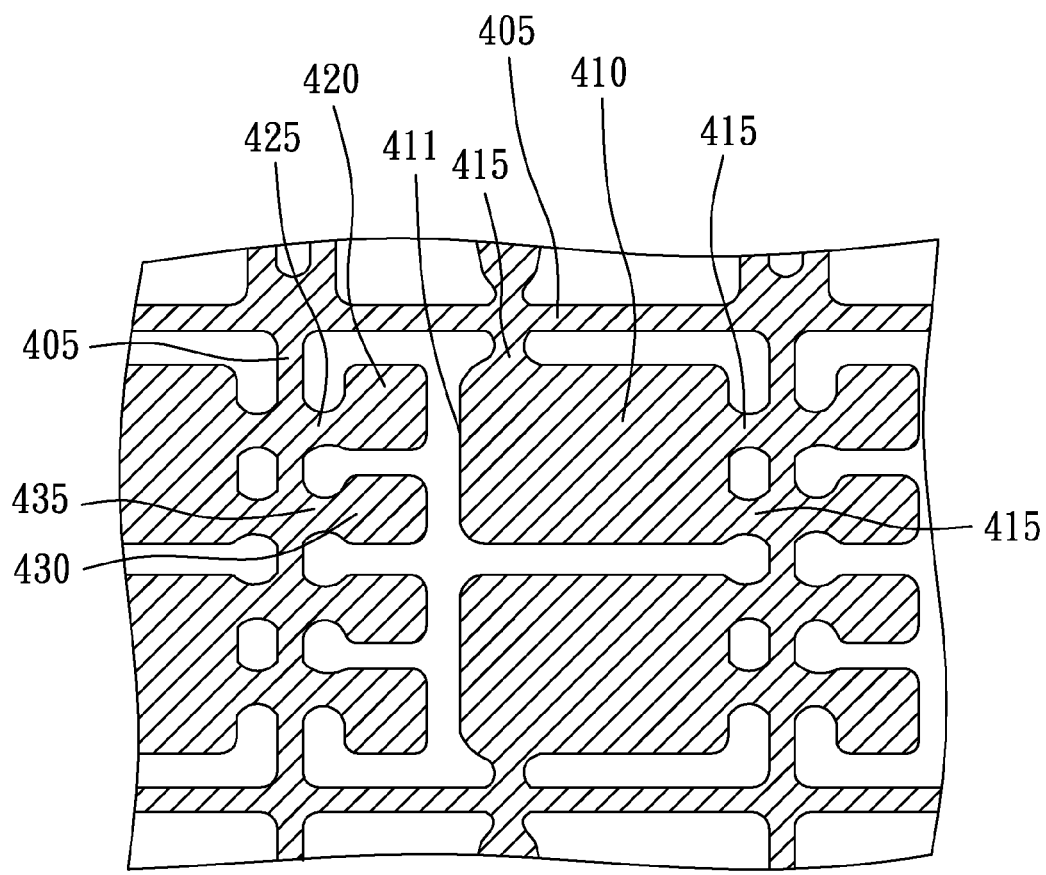

Embodiments of the present technology are directed toward semiconductor packaging techniques. Referring now to FIG. 4, a stage in the manufacture of a semiconductor package, in accordance with one embodiment of the present technology, is shown. The stage illustrated in FIG. 4 will be further explained with reference to FIG. 5, which is a partially enlarged view of FIG. 4. FIGS. 4 and 5 illustrate a substrate lead frame 400 including a frame portion 405 and a plurality of lead set 410, 420, 430 portions. For each set of leads, a first substrate lead 410 is coupled to the frame portion 405 by one or more extensions 415. A second substrate lead 420 and a third substrate lead 430 are coupled to the frame portion 405 by one or more respective extensions 425, 435. The second substrate lead 420 and third substrate lead 410 are separated by a space from the first substrate lead 410 along a first side 411 of the first substrate lead 410. In one implementation, the first substrate lead 410 is a first drain interconnect, the second substrate lead 420 is a first source interconnect, and the third substrate lead 430 is a first gate interconnect. In another implementation, the first substrate lead 410 is a first source interconnect, the second substrate lead 420 is a first drain interconnect, and the third substrate lead 430 is a first gate interconnect.

Figure 6:
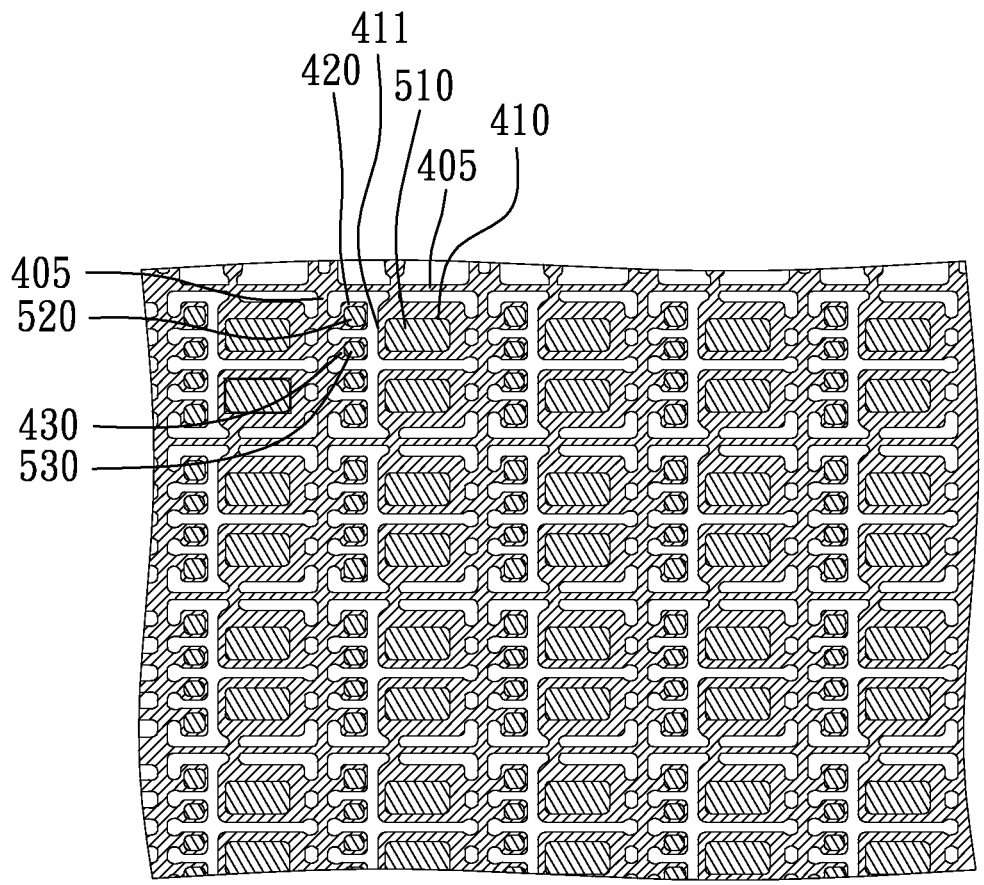
Figure 7:
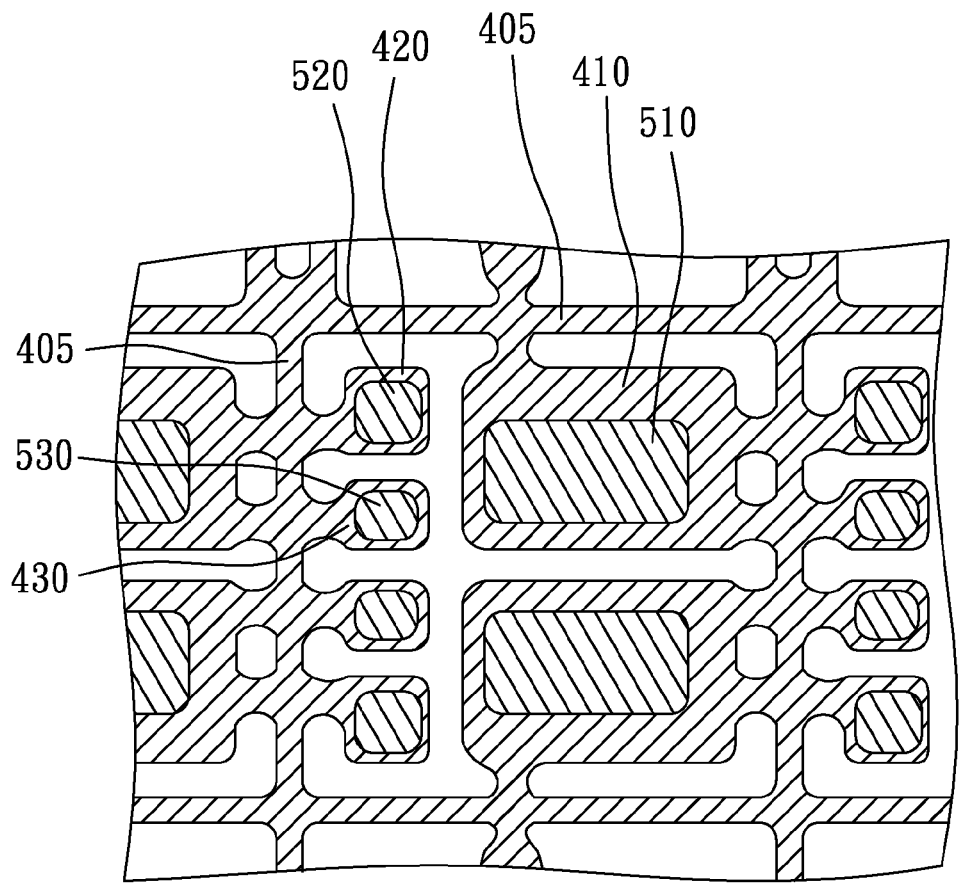

Referring now to FIG. 6, another stage in the manufacture of a semiconductor package, in accordance with one embodiment of the present technology is shown. The stage illustrated in FIG. 6 will be further explained with reference to FIG. 7, which is a partially enlarged view of FIG. 6. A first solder 510 is formed on the first substrate lead 410, a second solder 520 is formed on the second substrate lead 420, and a third solder 530 is formed on the third substrate lead 430.

Figure 8:
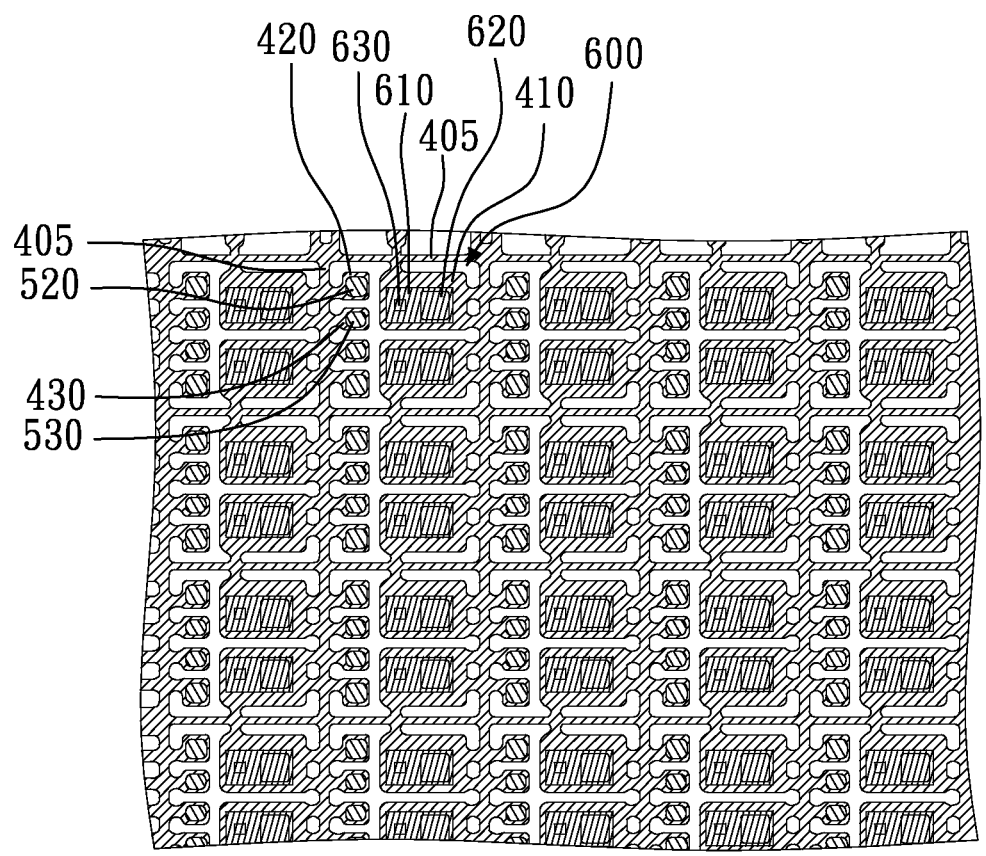
Figure 9:
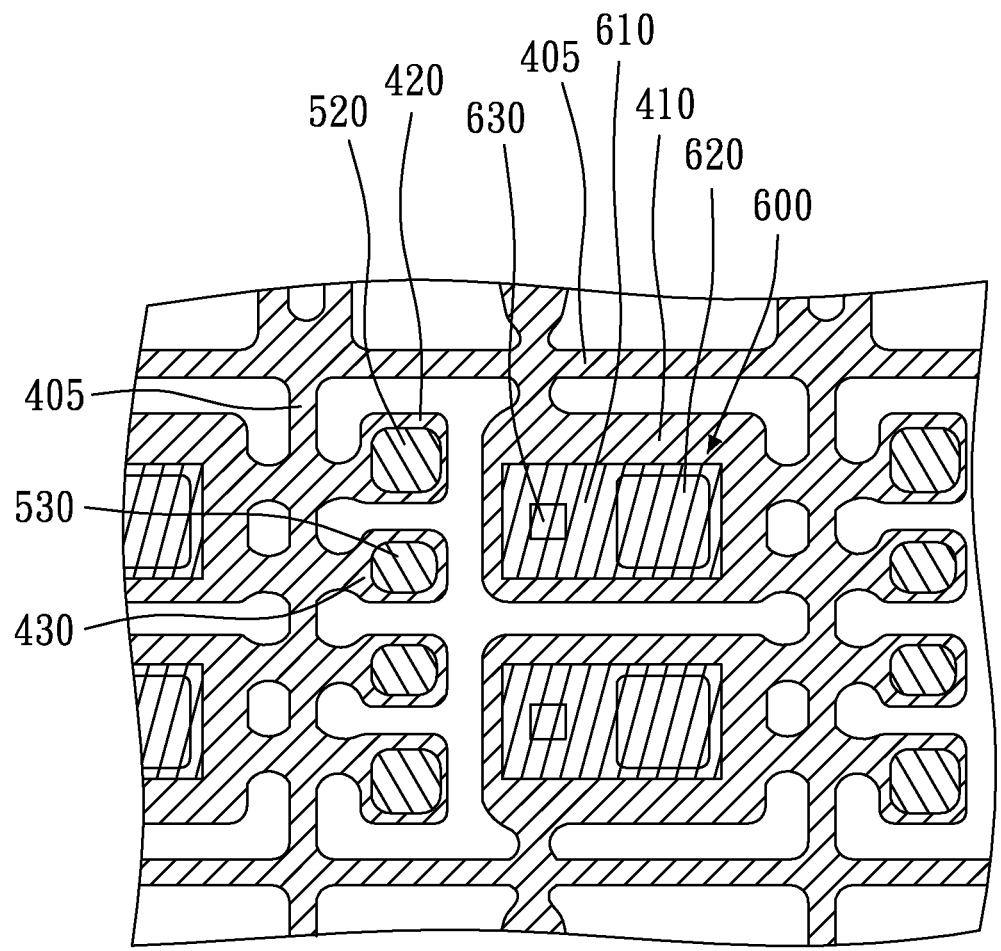

Referring now to FIG. 8, yet another stage in the manufacture of a semiconductor package, in accordance with one embodiment of the present technology, is shown. The stage illustrated m FIG. 8 will be further explained with reference to FIG. 9, which is a partially enlarged view of FIG. 8. An integrated circuit (IC) chip 600 is disposed on the first substrate lead 410 of each set of leads of the substrate lead frame. In one implementation, the IC chip 600 is a power metal-oxide-semiconductor field-effect transistor (MOSFET). Each IC chip 600 has an upper surface 610 and a lower surface 640 not shown in FIGS. 8 and 9). The lower surface has a first conductive region (not shown in FIGS. 8 and 9) disposed on the first solder 520 on the first substrate lead 410 of the substrate lead frame 400. The upper surface 610 of the IC chip 600 has a second conductive region 620 and a third conductive region 630. In the one implementation, the first conductive region is a drain conductive region, the second conductive region 620 is a source conductive region, and the third conductive region 630 is a gate conductive region. In the other implementation, the first conductive region is a source conductive region, the second conductive region 620 is a drain conductive region, and the third conductive region 630 is a gate conductive region.

Figure 10:
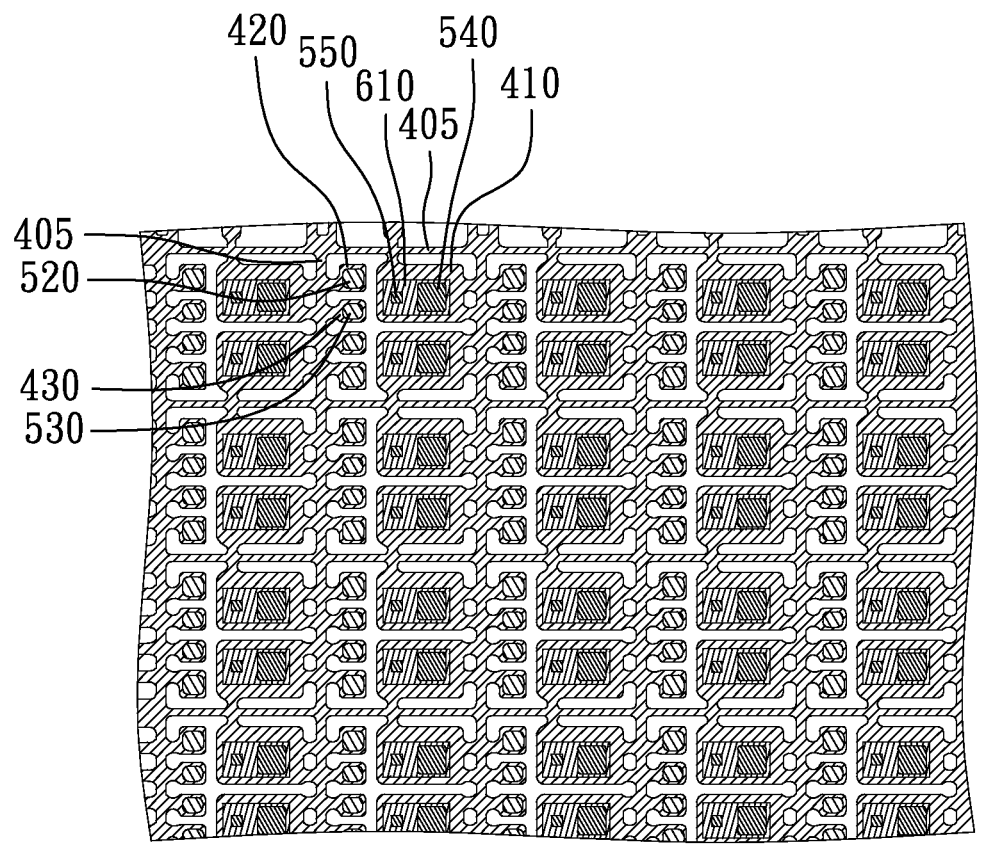
Figure 11:
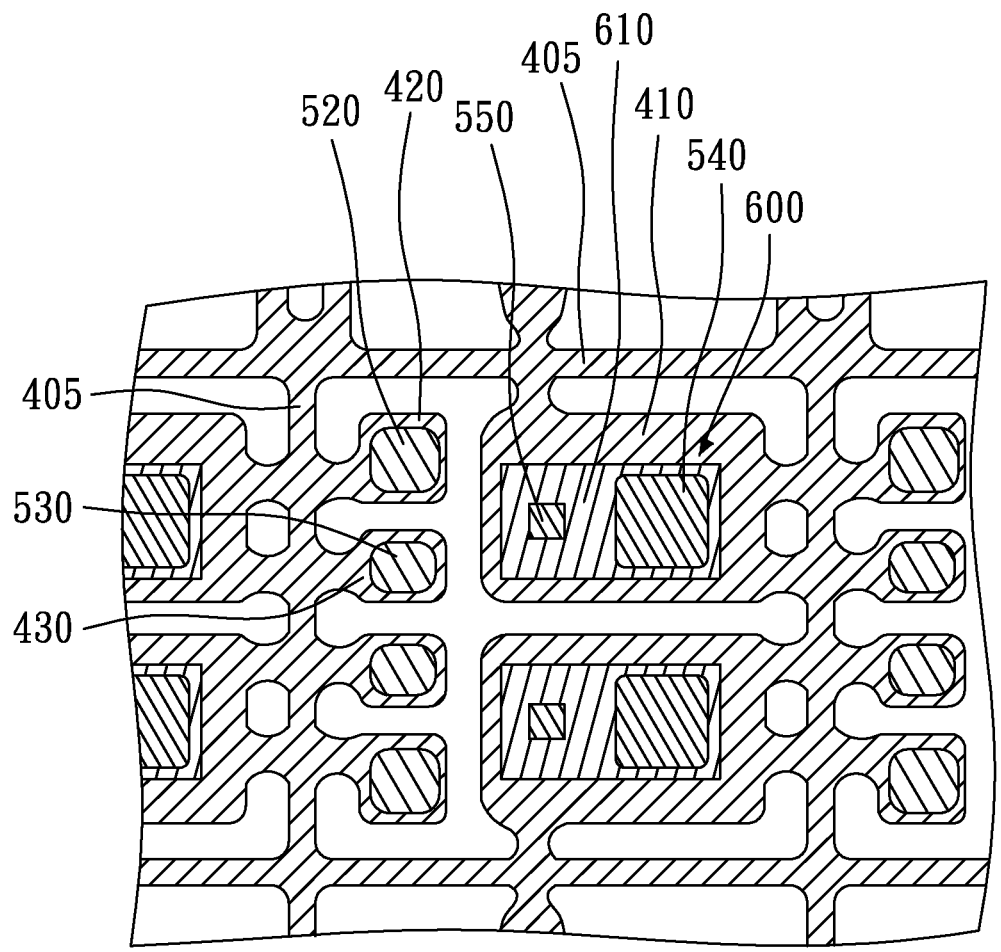

Referring now to FIG. 10, yet another stage in the manufacture of a semiconductor package, in accordance with one embodiment of the present technology, is shown. The stage illustrated in FIG. 10 will be further explained with reference to FIG. 11, which is a partially enlarged view of FIG. 10. As illustrated in FIGS. 10 and 11, a fourth solder 540 is formed on the second conductive region 620 and a fifth solder 550 is formed on the third conductive region 630 of the IC chip 600

Figure 12:
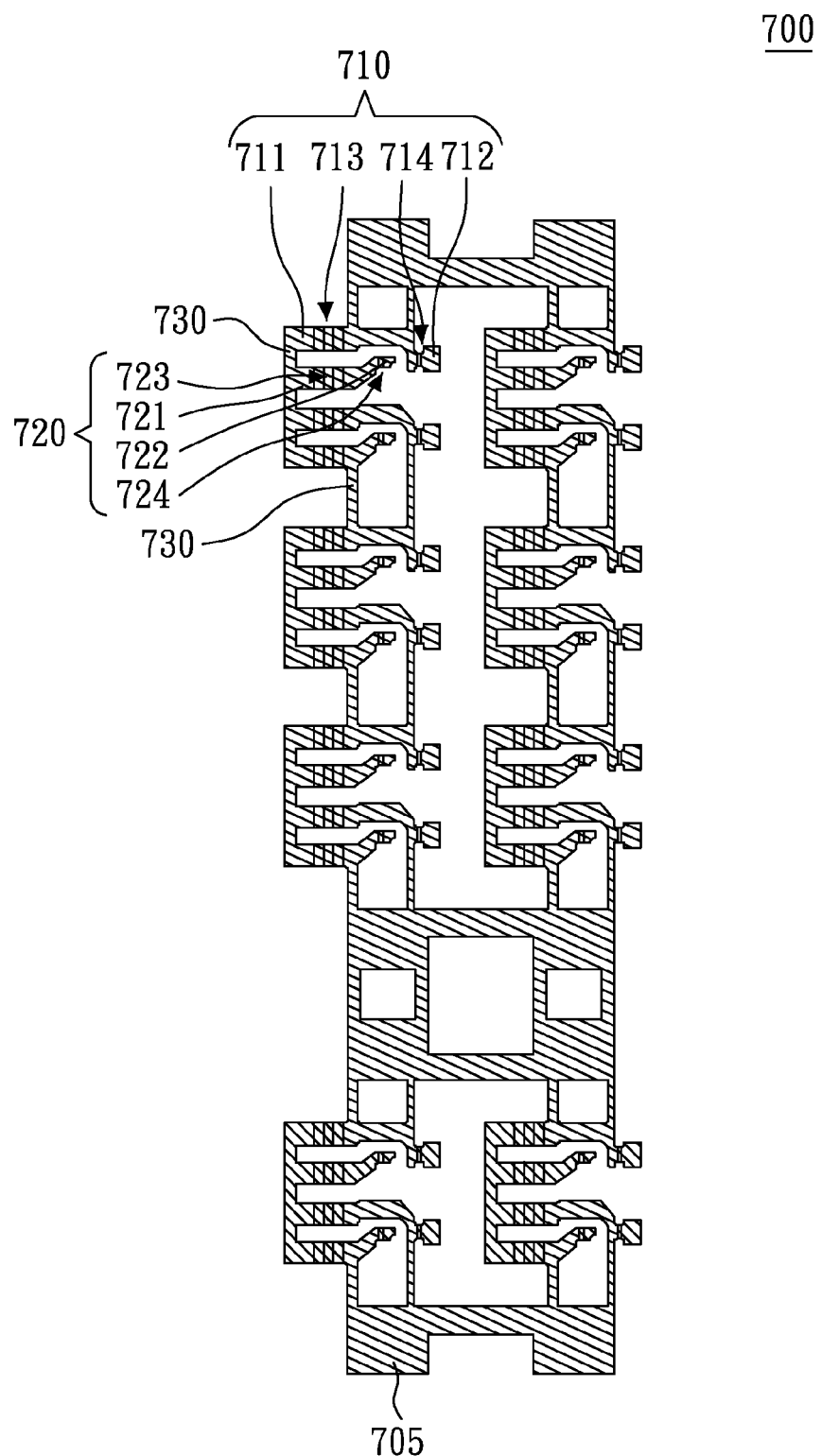
Figure 13:
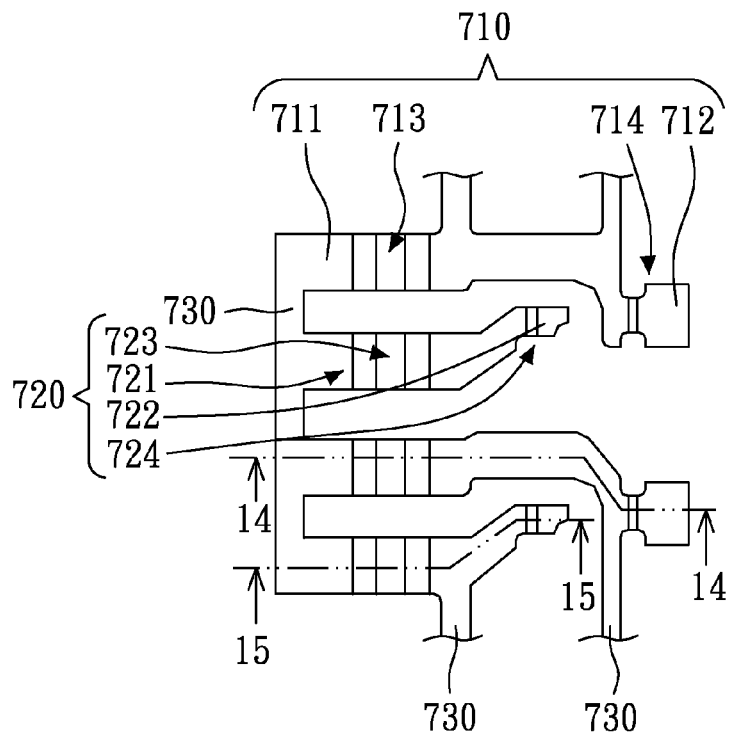
Figure 14:
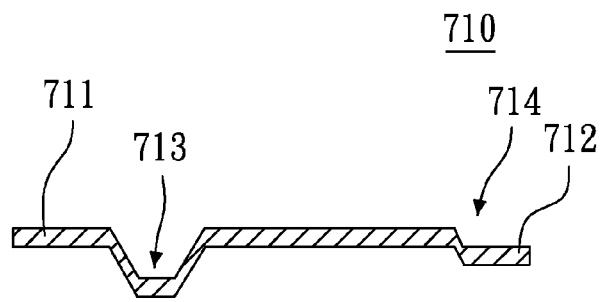
Figure 15:
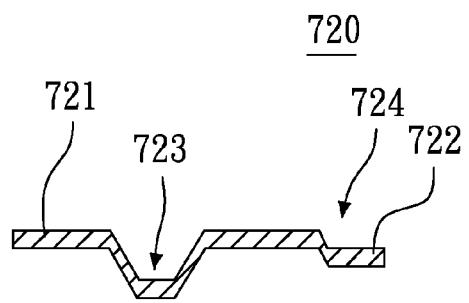

Referring now to FIG. 12, yet another stage in the manufacture of a semiconductor package, in accordance with one embodiment of the present technology, is shown. The stage illustrated in FIG. 12 will be further explained with reference to FIGS. 14 and 15. FIG. 13 is a partially enlarged view of FIG. 12. FIG. 14 is a cross-sectional view of FIG. 12 taken along line 14-14, and FIG. 15 is a cross-section view of FIG. 12 taken along line 15-15. FIGS. 12-15 illustrate a clip lead frame 700 including a frame portion 705 and a plurality of lead set 710, 720 portions. Each set of clip leads 710, 720 are coupled to the frame portion 705 by one or more respective extensions 730. In one implementation, the frame portion 705 includes one or more larger physical areas for providing an area required by absorption. In the one implementation, a first clip lead 710 is a second source interconnect, and a second clip lead 720 is a second gate interconnect, in the other implementation, the first clip lead 710 is a second drain interconnect$_s$ and the second clip lead 720 is a second gate interconnect.

Each of the first clip leads 710 includes a first end 711, a second end 712, a first recess 713 and a second recess 714. Each of the second clip leads 720 includes a first end 721, a second end 722, a first recess 723, and a second recess 724.

Figure 16:
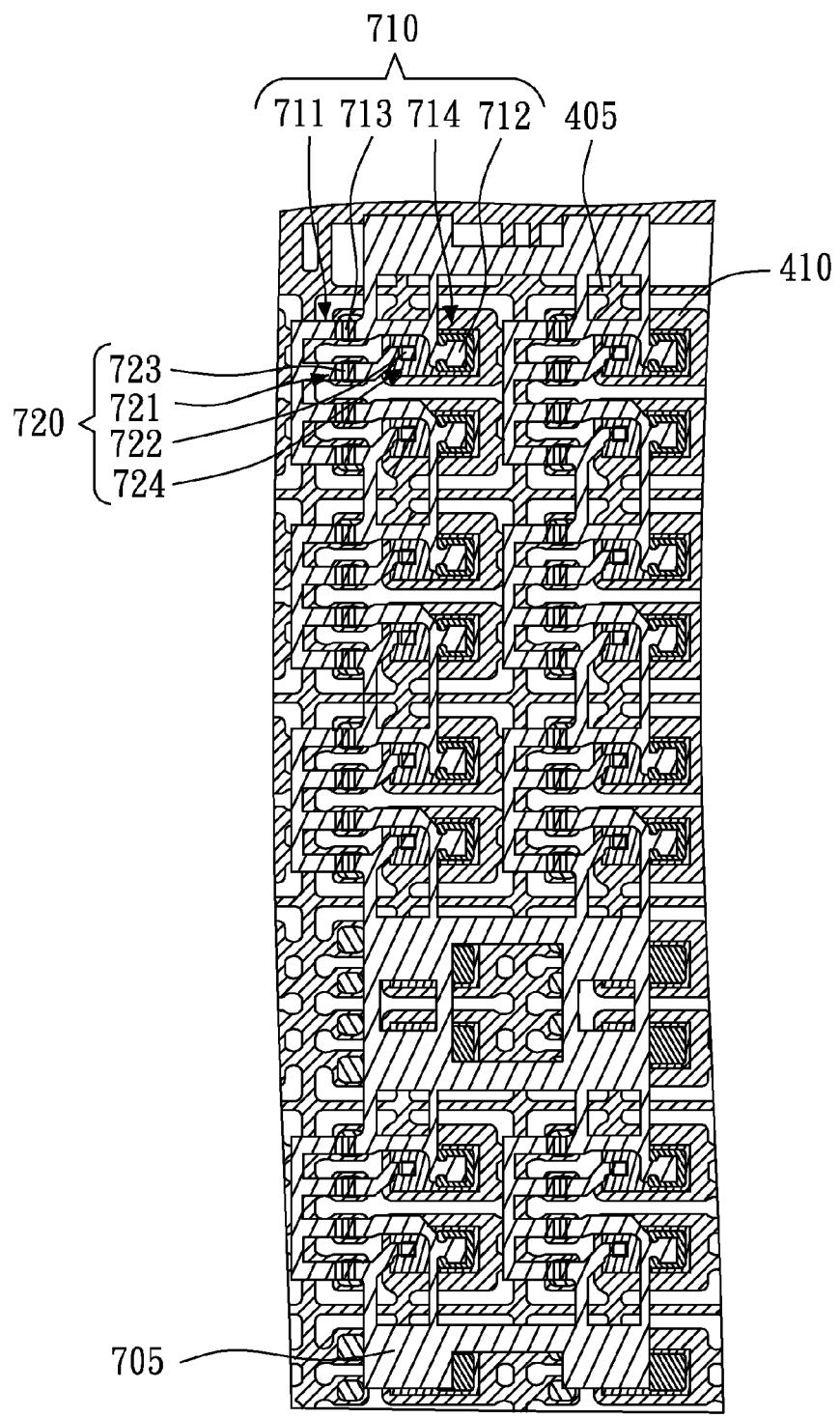
Figure 17:
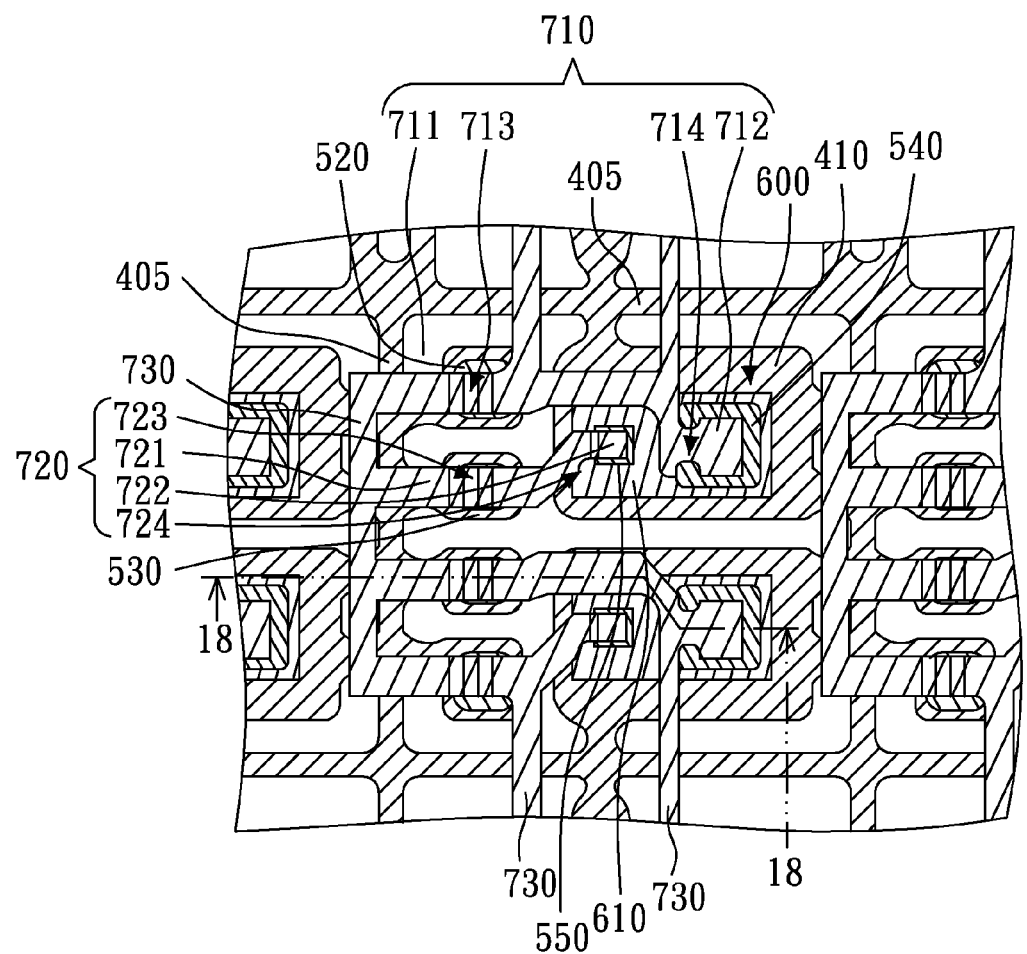
Figure 18:
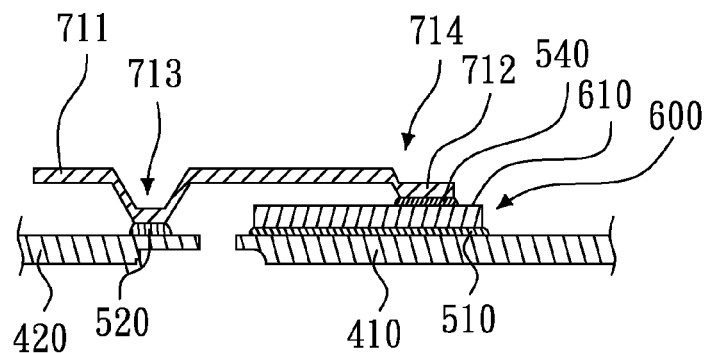

Referring now to FIG. 16, yet another stage in the manufacture of a semiconductor package, in accordance with one embodiment of the present technology, is shown. The stage illustrated in FIG. 16 will be further explained with reference to FIGS. 17 and 18. FIG. 17 is a partially enlarged view of FIG. 16. FIG. 18 is a cross-sectional view of FIG. 16 taken along line 18-18. FIGS. 16-18 illustrate assembly of the substrate lead frame 400, the IC chips 600, and the clip lead frame 700. The first clip lead 710 is disposed at the first recess 712 on the second solder 520 on the second substrate lead 420, and the second end 712 of the first clip lead 710 is disposed on the fourth solder 540 on the second conductive region 620 of the IC chip 600 The second dip had 720 is disposed at the first recess 724 on the third solder 530 on the third substrate lead 430, and the second end 722 of the second clip lead 720 is disposed on the fifth solder 550 on the third conductive region 630 of the IC chip 600.

A solder reflow process is performed to electrically and mechanically connect the clip leads 710, 720 of the clip lead frame 700, the IC chips 600 and the substrate leads 410, 420, 430 of the substrate lead frame 400 together. As a result, the first clip lead 710 is electrically and mechanically coupled at the first recess 712 to the second substrate lead 420, and the second end 712 of the first clip lead 710 is electrically and mechanically coupled to the second conductive region 620 of the IC chip 600. The second clip lead 720 at the first recess 724 is electrically and mechanically coupled to the third substrate lead 430, and the second end 722 of the second clip lead 720 is electrically and mechanically coupled to the third conductive region 630 of the IC chip 600.

Figure 19:
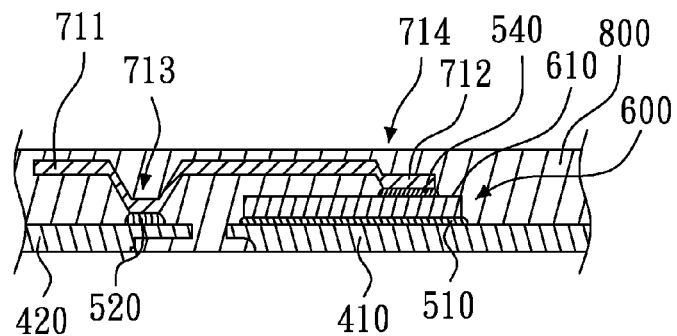

Referring now to FIG. 19, yet another stage in the manufacture of a semiconductor package, in accordance with one embodiment of the present technology, is shown. In FIG. 19 a molding process is performed. The substrate lead frame 400 the IC chips 600 and the clip lead frame 700 coupled together are placed in a mold cavity (not shown and then a molding compound 800 is filled in the mold cavity to encapsulate the substrate had frame 400 the IC chips 600 and the dip lead frame 700. In one implementation, the first, second and third substrate leads 410, 420, 430 are exposed outside the molding compound 800.

Figure 20:
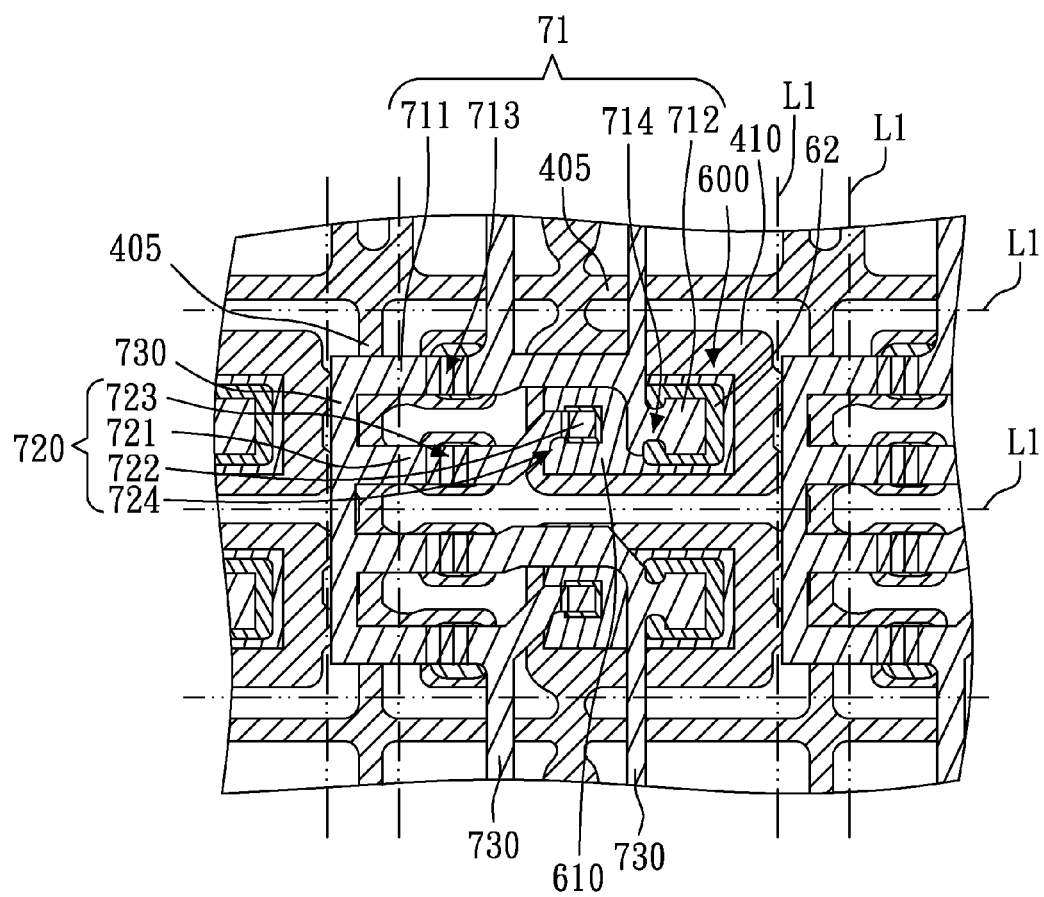
Figure 21:
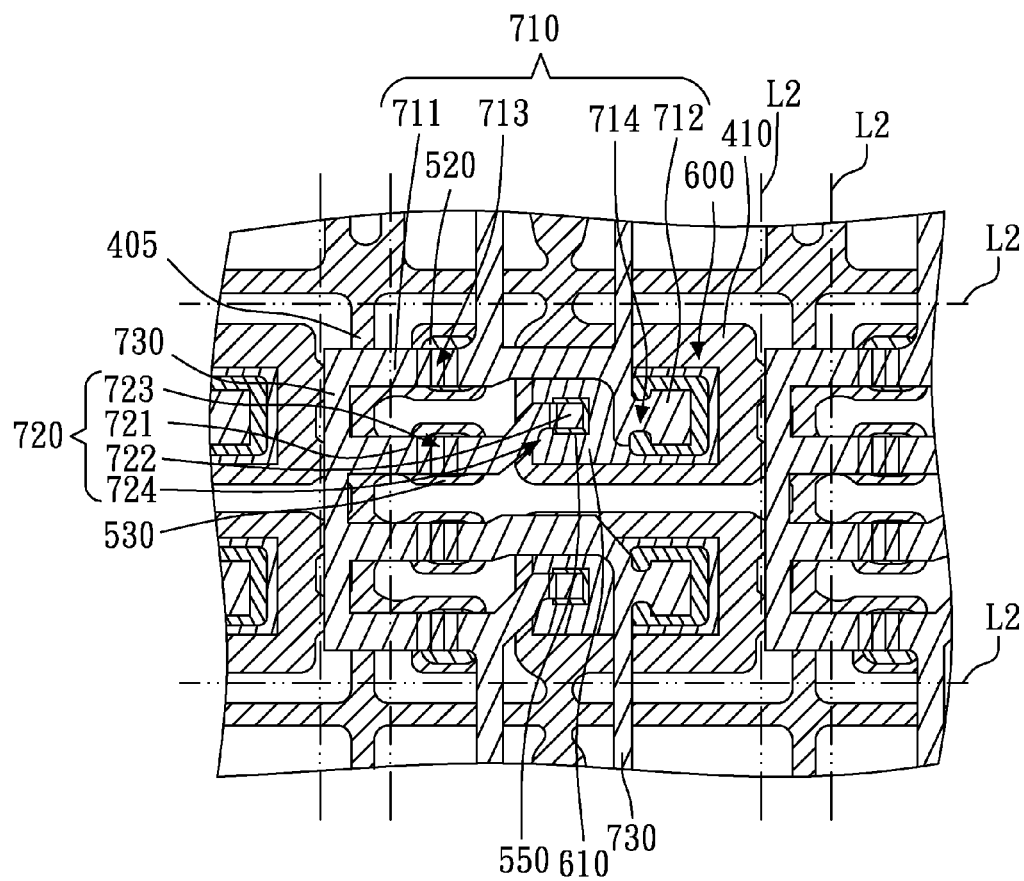

Referring now to FIGS. 20 and 21 yet another stage in the manufacture of a semiconductor package, in accordance with one embodiment of the present technology, is shown. As illustrated in FIG. 20, a cutting process may be performed along first cutting lines L1. As illustrated in FIG. 21, an alternative cutting process may be performed along second cutting lines L2. Cutting along lines L1 or L2 separates the substrate leads 410, 420, 430 from the substrate frame 405 and from each other. Cutting along lines L1 or L2 also separates the clip leads 710, 720 from the clip frame 705 and from each other, However, second substrate lead 420 remains electrically and mechanically coupled to the first clip lead 710 and the third substrate lead 430 remains electrically and mechanically coupled to the second clip lead 720.

Figure 22:
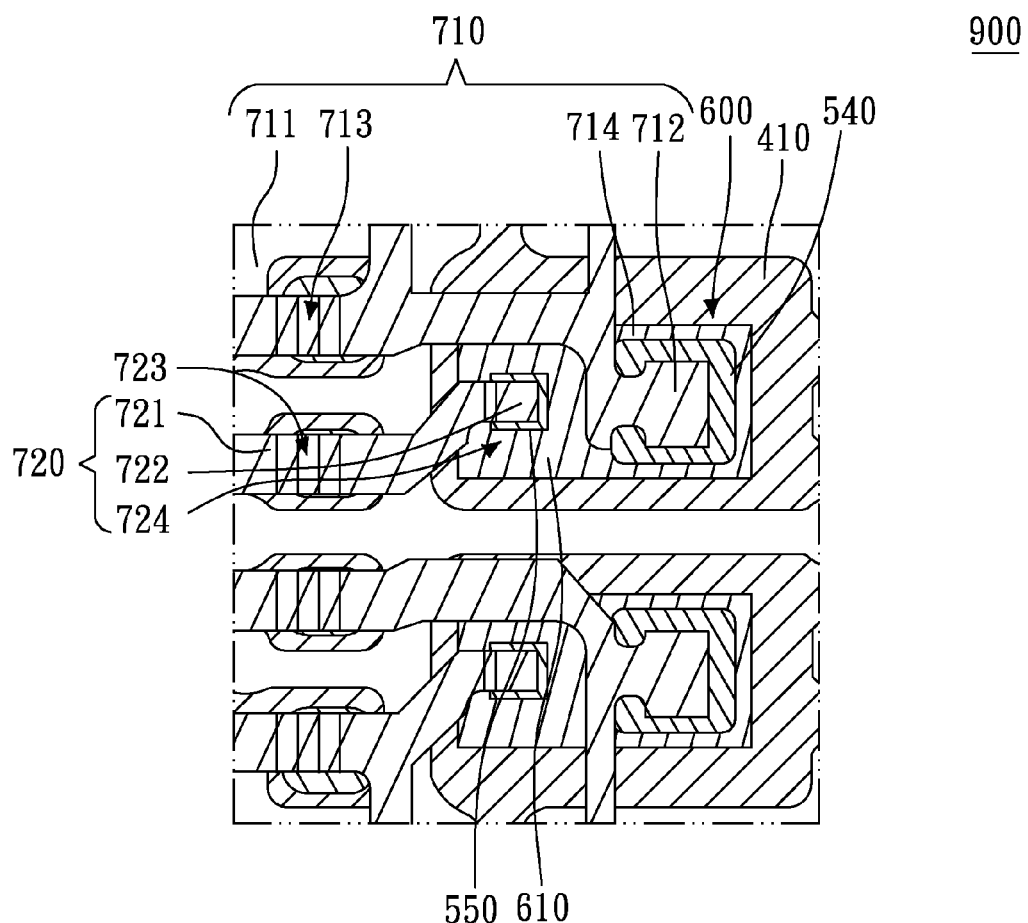
Figure 23:
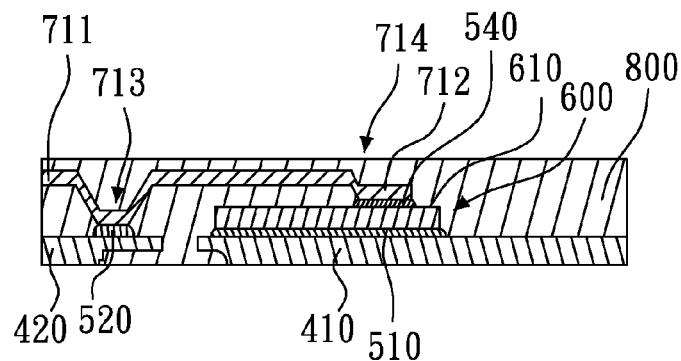

Referring now to FIGS. 22 and 23, yet another stage in the manufacture of a semiconductor package, in accordance with another embodiment of the present technology, is shown. FIG. 22 shows a top view of a semiconductor package 900 inside the molding compound. FIG. 23 shows a side sectional view of the semiconductor package 900. FIG. 22 illustrates the semiconductor package 900 including two IC chips 600 resulting from cutting along cut lines L2 in FIG. 21.

The semiconductor package 900, in accordance with embodiments of the present invention includes one or more IC chips 400. A first conductive region on a first surface of a respective IC chip 400 is electrically and mechanically coupled to a first substrate lead 410. A first dip lead 710 is electrically and mechanically coupled between a second conductive region on the second surface of the respective IC chip 400 and a second substrate lead 420. A second clip lead 720 is electrically and mechanically coupled between a third conductive region on the second surface of the respective IC chip 400 and a third substrate lead 420. The one or more IC chips 400, the respective first, second and third substrate leads 410, 420,430 and the first and second clip leads 710, 720 are encapsulated, except for package contact portions of the first, second and third substrate leads 410, 420, 430. in the one implementation, the first substrate lead 410 is a drain interconnect, the coupled together first clip lead 710 and second substrate lead 420 is a source interconnect. and the coupled together second dip lead 720 and third substrate lead 430 is a gate interconnect of the respective IC chip 400 within the package 900. In the other implementation, the first substrate lead 410 is a source interconnect, the coupled together first clip lead 710 and second substrate lead 420 is a drain interconnect, and the coupled together second clip lead 720 and third substrate lead 430 is a gate interconnect of the respective IC chip 400 within the package 900

Embodiments of the present technology are advantageously adaptable to manufacturing integrated circuit packages including one or more IC chips. Moreover, embodiments of the present technology do not utilize gold wires to may package interconnects, which effectively saves on material cost. In addition, the whole clip lead frame 700 of the present technology is integrally placed to effectively save processing time The clip lead frame 700 may be fabricated through etching or other sophisticated techniques to narrow a space between the clip leads 710, 720, so that the clip lead frame 700 is applicable to IC chips 600 having a small size.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A semiconductor package, comprising:
   a substrate lead frame, comprising at least one substrate frame, at least one first substrate lead, at least one second substrate lead, and at least one third substrate lead, wherein the first substrate lead is connected to the substrate frame, the second substrate lead and the third substrate lead face a side of the first substrate lead, the second substrate lead has a first extension portion, and the third substrate lead has a second extension portion;
   at least one chip, each located on the respective first substrate lead and having an upper surface and a lower surface, wherein the upper surface has a second conductive region and a third conductive region, the lower surface has a first conductive region, and the first conductive region is electrically connected to the first substrate lead;
   a clip lead frame, located on the at least one chip and having at least one first clip lead and at least one second clip lead, wherein the first clip lead is electrically connected between the second conductive region of the at least one chip and the at least one second substrate lead, and the second clip lead is electrically connected between the third conductive region of the at least one chip and the at least one third substrate lead; and
   a molding compound, encapsulating the substrate lead frame, the at least one chip, and the clip lead frame, wherein the at least one first substrate lead, the at least one second substrate lead, the at least one third substrate lead are exposed to a side surface of the molding compound.

2. The semiconductor package according to claim 1, wherein a space exists between the second substrate lead and the side of the first substrate lead and between the third substrate lead and the side of the first substrate lead.

3. The semiconductor package according to claim 1, further comprising:
   a first solder, for connecting the at least one first substrate lead and the at least one chip, connecting the second substrate lead and the first clip lead, and connecting the third substrate lead and the second clip lead; and
   a second solder, for connecting the first clip lead and the second conductive region of the at least one chip and connecting the second clip lead and the third conductive region of the at least one chip.

4. The semiconductor package according to claim 1, wherein the at least one first clip lead has a first end and a second end, the at least one second clip lead has a third end and a fourth end, the fist end of the first dip lead is electrically connected to the second conductive region of the at least one chip, the third end of the second clip lead is electrically connected to the third conductive region of the at least one chip.

5. The semiconductor package according to claim 1, wherein the at least one first clip lead has a first recess and a second recess, the at least one second clip lead has a third recess and a fourth recess, the at least one first dip lead is electrically connected to the second conductive region of the at least one chip through the first recess, the at least one first clip lead is electrically connected to the second substrate lead through the second recess, the second dip lead is electrically connected to the thud conductive region of the at least one chip through the third recess, and the second dip lead is electrically connected to the third substrate lead through the fourth recess.

6. The semiconductor package according to claim 1, wherein the first substrate lead is a drain pin, the second substrate lead is a source pin, the third substrate lead is a gate pin, the first conductive region is a drain conductive region, the second conductive region is a source conductive region, the third conductive region is a gate conductive region, the first clip lead is a source connection segment, and the second clip lead is a gate connection segment.

7. The semiconductor package according, to claim 1, wherein the first substrate lead is a source pin, the second substrate lead is a drain pin, the third substrate lead is a gate pin, the first Conductive region is a source conductive region, the second conductive region is a drain conductive region, the third conductive region is a gate conductive region, the first clip lead is a drain connection segment, and the second clip lead is a gate connection segment.

* * * * *